United States Patent
Abouzied et al.

(10) Patent No.: US 12,407,428 B2
(45) Date of Patent: Sep. 2, 2025

(54) RADIO-FREQUENCY POWER DETECTOR WITH NON-LINEARITY CANCELLATION

(71) Applicant: Apple Inc., Cupertino, CA (US)

(72) Inventors: Mohamed Abouzied, La Jolla, CA (US); Abbas Komijani, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 423 days.

(21) Appl. No.: 18/181,466

(22) Filed: Mar. 9, 2023

(65) Prior Publication Data

US 2024/0305389 A1    Sep. 12, 2024

(51) Int. Cl.
    *H04B 17/15*        (2015.01)

(52) U.S. Cl.
    CPC .................................. *H04B 17/15* (2015.01)

(58) Field of Classification Search
CPC .......... H04B 17/15; H04B 1/40; G01R 21/01; G01R 21/10; H03F 1/14; H03F 1/223; H03F 1/3205; H03F 1/3276; H03F 3/265; H03F 3/45475; H03F 2200/105; H03F 2200/465; H03F 2203/45526; H03F 3/245; H03F 3/195; H03F 2200/451; H03F 3/19; H03F 1/0272; H03F 1/32; H03F 3/24; H03G 3/3042
See application file for complete search history.

(56) References Cited

U.S. PATENT DOCUMENTS

| | | |
|---|---|---|
| 7,110,718 B1 | 9/2006 | Szczeszynski et al. |
| 7,447,064 B1 * | 11/2008 | Bu .......................... H10B 41/30 257/E21.422 |
| 8,339,179 B2 * | 12/2012 | Sun ....................... H03G 3/3052 327/356 |
| 8,698,562 B2 * | 4/2014 | Kondo ................... H03F 1/0272 330/276 |
| 9,823,358 B2 * | 11/2017 | Scott ........................ G01T 7/005 |
| 9,985,601 B2 * | 5/2018 | Wang ....................... H03H 7/25 |
| 11,159,191 B1 * | 10/2021 | Mohammadnezhad ..................... H03G 3/3052 |

(Continued)

FOREIGN PATENT DOCUMENTS

| | | |
|---|---|---|
| KR | 20100136991 A | 12/2010 |
| WO | 2011021995 A1 | 2/2011 |

OTHER PUBLICATIONS

Zhou Yijun et al., "A Low-Power Ultra-Wideband CMOS True RMS Power Detector", IEEE, May 1, 2008, pp. 1052-1058, vol. 56 No. 5, New York, NY.

*Primary Examiner* — Ankur Jain
(74) *Attorney, Agent, or Firm* — Treyz Law Group; Jason Tsai

(57) ABSTRACT

Wireless circuitry can include a radio-frequency amplifier and a power detection circuit coupled to an output of the radio-frequency amplifier. The power detection circuit can include an input transistor, a biasing circuit configured to output a bias voltage for the input transistor and configured to track temperature and voltage variations, and a non-linearity cancellation component configured to generate a current that at least partially cancels a non-linear current associated with the input transistor. The input transistor may be an n-type transistor, and the non-linearity cancellation component may be a p-type metal-oxide-semiconductor capacitor. The biasing circuit can include n-type and p-type diode-connected bias transistors.

20 Claims, 8 Drawing Sheets

(56) References Cited

U.S. PATENT DOCUMENTS

| | | | |
|---|---|---|---|
| 11,239,856 B1 * | 2/2022 | Innocent | H04N 25/772 |
| 11,316,515 B2 * | 4/2022 | Hoogzaad | H03K 17/063 |
| 11,528,022 B2 * | 12/2022 | Mikhael | G05F 1/46 |
| 2011/0074509 A1 | 3/2011 | Samavedam et al. | |
| 2022/0069835 A1 | 3/2022 | Verma et al. | |

* cited by examiner

RADIO-FREQUENCY POWER DETECTOR WITH NON-LINEARITY CANCELLATION

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through a power amplifier, which is configured to amplify low power analog signals to higher power signals more suitable for transmission through the air over long distances. Radio-frequency signals received at an antenna can be fed through a low noise amplifier, which is configured to amplify low power analog signals to higher power signals for ease of processing at a receiver. It can be challenging to design a satisfactory radio-frequency amplifier for an electronic device.

Summary

An electronic device may include wireless communications circuitry. The wireless communications circuitry may include one or more processors or signal processing blocks for generating baseband signals, a transceiver for upconverting (modulating) the baseband signals to radio frequencies and for downconverting (demodulating) radio-frequency signals to baseband signals, a radio-frequency power amplifier for amplifying radio-frequency signals prior to transmission at one or more antennas, and a radio-frequency low noise amplifier for amplifying radio-frequency signals received at one or more antennas in the electronic device.

An aspect of the disclosure provides wireless circuitry that includes a radio-frequency amplifier and a power detection circuit coupled to an output of the radio-frequency amplifier. The power detection circuit can include an input transistor having a gate terminal coupled to the output of the radio-frequency amplifier and a non-linearity cancellation component coupled to the gate terminal of the input transistor. The non-linearity cancellation component can be a metal-oxide-semiconductor (MOS) capacitor. The power detection circuit can further include an additional input transistor having a gate terminal coupled to the output of the radio-frequency amplifier and an additional MOS capacitor having a gate terminal coupled to the gate terminal of the additional input transistor and having a body terminal coupled to a shunt capacitor.

The power detection circuit can further include a first bias transistor having a source terminal coupled to the body terminal of the MOS capacitor and coupled to a first current source, a gate terminal, and a drain terminal shorted to its gate terminal. The power detection circuit can further include a second bias transistor having a source terminal coupled to a ground line, a drain terminal coupled to the drain terminal of the first bias transistor, and a gate terminal shorted to its drain terminal, the second bias transistor being configured to provide a bias voltage to the gate terminal of the input transistor. The power detection circuit can further include a first cascode transistor coupled in series with the input transistor, a second cascode transistor, and a third bias transistor having a source terminal coupled to the drain terminal of the second bias transistor, a drain terminal coupled to a second current source, and a gate terminal shorted to its drain terminal, the third bias transistor being configured to provide a cascode bias voltage to the gate terminals of the first and second cascode transistors.

An aspect of the disclosure provides a power detection circuit that includes a first input transistor configured to receive a radio-frequency signal, a second input transistor configured to receive the radio-frequency signal, a biasing circuit configured to provide bias voltages for the first and second input transistors, and a first non-linearity cancellation component coupled between the first input transistor and the biasing circuit. The power detection circuit can further include a second non-linearity cancellation component coupled between the second input transistor and the biasing circuit. The first non-linearity cancellation component can be a first metal-oxide-semiconductor (MOS) capacitor having a gate terminal coupled to a gate terminal of the first input transistor and having a body terminal coupled to the biasing circuit, whereas the second non-linearity cancellation component can be a second metal-oxide-semiconductor (MOS) capacitor having a gate terminal coupled to a gate terminal of the second input transistor and having a body terminal coupled to the biasing circuit. The bias circuit can include a first diode-connected bias transistor having a terminal coupled to the first and second non-linearity cancellation components and coupled to a first current source, a second diode-connected bias transistor coupled to the first diode-connected bias transistor and configured to output the bias voltages, and a third diode-connected bias transistor coupled to the second diode-connected bias transistor, having a terminal coupled to a second current source, and configured to output a cascode bias voltage to a cascode transistor coupled to the first and second input transistors.

An aspect of the disclosure provides circuitry that includes an input transistor configured to receive a radio-frequency signal from a radio-frequency amplifier, a biasing circuit configured to output a bias voltage for the input transistor and configured to track temperature and voltage variations, and a non-linearity cancellation component configured to generate a current that at least partially cancels a non-linear current associated with the input transistor. The non-linearity cancellation component can be a metal-oxide-semiconductor (MOS) capacitor having a first terminal coupled a gate terminal of the input transistor and having a second terminal coupled to the biasing circuit. The circuitry can further include an additional input transistor configured to receive the radio-frequency signal from the radio-frequency amplifier and an additional non-linearity cancellation component configured to generate a current that at least partially cancels a non-linear current associated with the additional input transistor.

The input transistor and the additional input transistor can optionally be n-type input transistors. The non-linearity cancellation component can optionally be a first p-type metal-oxide-semiconductor (MOS) capacitor having a gate terminal coupled a gate terminal of the input transistor and having a body terminal coupled to the biasing circuit. The additional non-linearity cancellation component can optionally be a second p-type metal-oxide-semiconductor (MOS) capacitor having a gate terminal coupled a gate terminal of the additional input transistor and having a body terminal coupled to the biasing circuit. The biasing circuit can include a p-type bias transistor having a source terminal coupled to the first and second p-type MOS capacitors and coupled to a current source, a gate terminal, and a drain terminal coupled its gate terminal.

DETAILED DESCRIPTION

Figure 1:
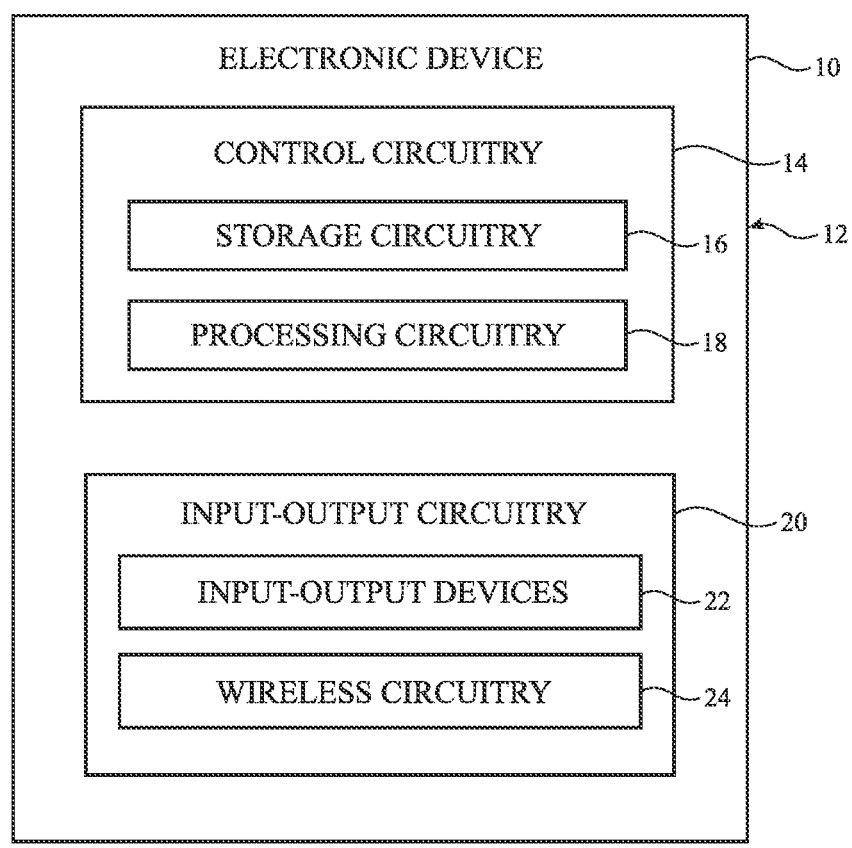
FIG. 1 is a diagram of an illustrative electronic device having wireless circuitry in accordance with some embodiments.

An electronic device such as device 10 of FIG. 1 may be provided with wireless circuitry. Wireless circuitry can include radio-frequency amplifiers such as power amplifiers and low noise amplifiers. Power amplifiers can be used to amplify radio-frequency signals in a transmit path, whereas low noise amplifiers can be used to amplify radio-frequency signals in a receive path. Power detection circuits can be coupled at the outputs of these radio-frequency amplifiers. A power detector coupled at the output of a radio-frequency power amplifier can be configured to run an adaptive power control algorithm for adjusting a power level of the power amplifier, whereas a power detector coupled at the output of a radio-frequency low noise amplifier can be used to run an automatic gain control algorithm for adjusting a power level of the low noise amplifier.

Attaching power detection circuits to radio-frequency amplifiers can, however, degrade the amplifiers' linearity. In accordance with some embodiments, one or more non-linearity canceling component(s) can be coupled at the input of the power detector to help mitigate or counteract any non-linear effects associated with the power detector. The non-linearity canceling component(s) can be implemented using one or more p-type metal-oxide-semiconductor (MOS) capacitor or other types of capacitive component. The non-linearity canceling component(s) can be coupled to a biasing circuit that tracks process, temperature, and voltage (PVT) variations. Configured and operated in this way, a third-order intercept point (IP3) of a radio-frequency amplifier can be improved, which can enhance the throughput of the amplifier.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
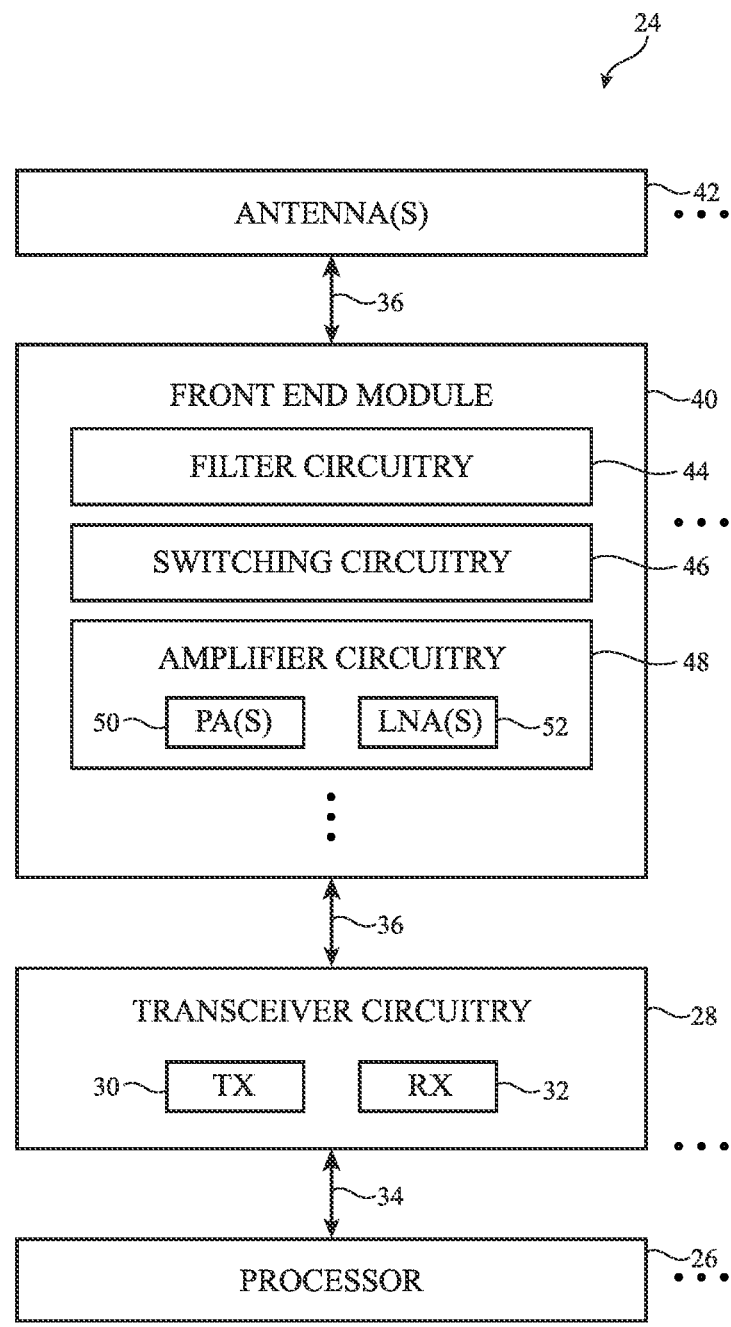
FIG. 2 is a diagram of illustrative wireless circuitry having radio-frequency amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is Illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 configured to generate a current that at least partially cancels a non-linear current associated with the input transistor into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), signal attenuators, impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end module 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, radio transceiver circuitry that handles unlicensed radio bands reserved for industrial, scientific, and medical (ISM) purposes, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
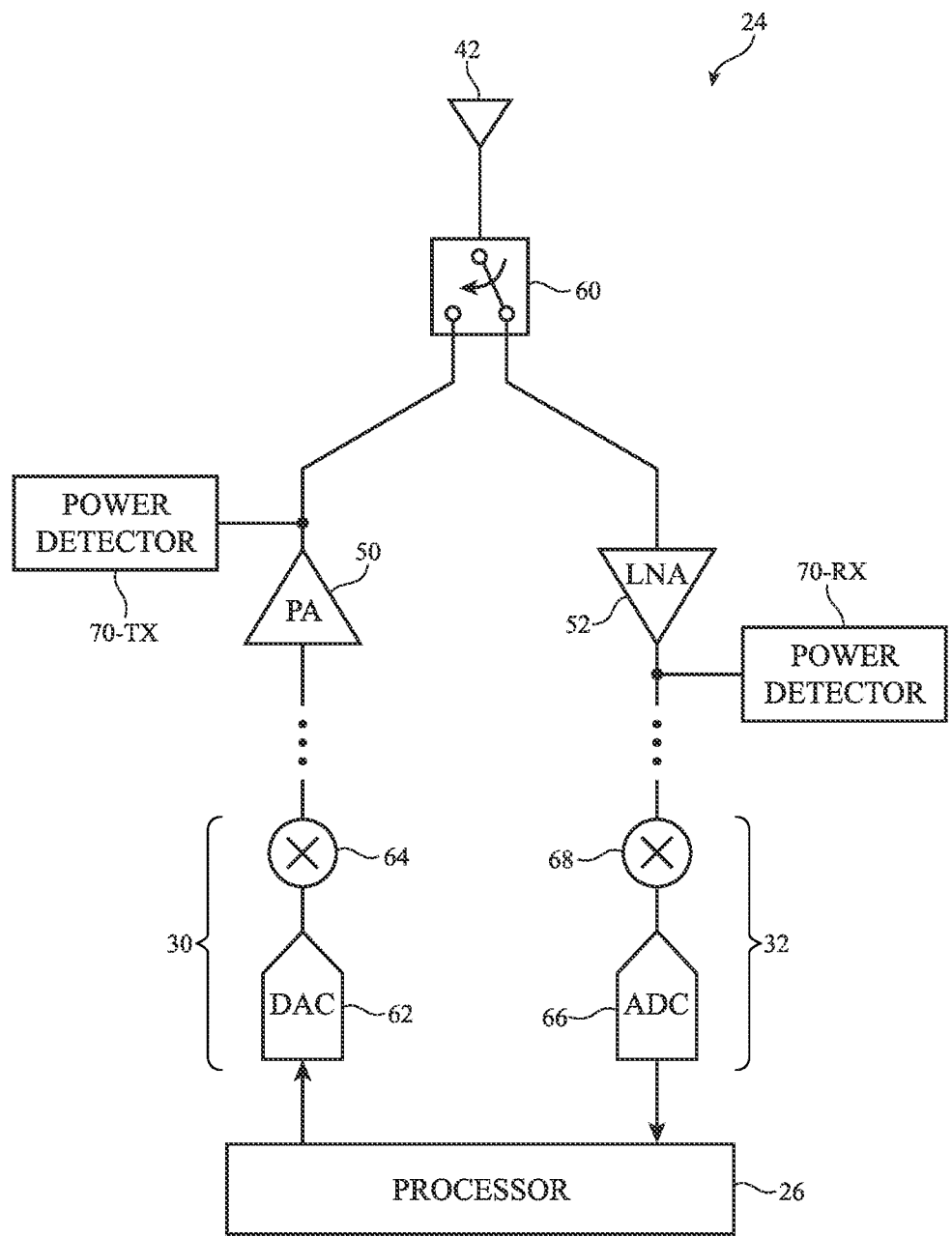
FIG. 3 is a diagram showing illustrative power detectors coupled to radio-frequency amplifier outputs in accordance with some embodiments.

Radio-frequency amplifiers may be coupled to power detectors for power monitoring purposes. FIG. 3 is a diagram showing illustrative power detectors coupled to radio-frequency amplifier outputs. As shown in FIG. 3, wireless circuitry 24 can have one or more antenna 42 that is coupled to a transmit path and a receive path via a radio-frequency duplexing circuit such as duplexer 60. Duplexer 60 may have a first port coupled to a shared antenna 42, a second port coupled to the transmit path (e.g., a second port configured to receive amplified radio-frequency signals to be radiated by antenna 42), and a third port coupled to the receive path (e.g., a third port to which radio-frequency signals received by antenna 42 are conveyed).

The receive path can include low noise amplifier (LNA) circuitry 52, a downconverting mixing circuit such as mixer 68, and a data converter such as analog-to-digital converter (ADC) 66. The LNA circuitry 52 can include one or more amplifiers coupled in series and/or in parallel. Mixer 68 may use a local oscillator signal to downconvert (or demodulate) the radio-frequency signals to baseband (or intermediate) frequencies. Analog-to-digital converter (ADC) circuit 66 can then convert the demodulated signals from the analog domain to the digital domain to generate corresponding digital baseband signals. Mixer 68 and ADC circuit 66 are sometimes be considered part of receiver circuitry 32. The digital baseband signals can then be received by one or more processors 26. Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18 (see FIG. 1).

The circuitry described above for processing signals received by antenna 42 is sometimes referred to collectively as wireless receiving circuitry. If desired, one or more additional front end module components such as radio-frequency filter circuitry 44 of FIG. 2 (e.g., low pass filters, high pass filters, notch filters, band pass filters, attenuators, multiplexing circuitry, duplexer circuitry, diplexer circuitry, triplexer circuitry, etc.), switching circuitry 46 (e.g., one or more radio-frequency switches), impedance matching circuitry, antenna tuning circuitry (e.g., networks of capacitors, resistors, inductors, and/or switches that adjust the frequency response of antenna 42), radio-frequency coupler circuitry, charge pump circuitry, power management circuitry, and/or any other desired front-end module circuitry can optionally be coupled at the input and/or output of LNA circuitry 52 along the radio-frequency reception line path.

On the other hand, the transmit path can include power amplifier (PA) circuitry 50, a upconverting mixing circuit such as mixer 64, and a data converter such as digital-to-analog converter (DAC) 62. Processor 26 can generate digital baseband signals, sometimes referred to as digital signals for transmission. DAC circuit 62 can convert the digital baseband signals from the digital domain to the analog domain to generate corresponding analog baseband signals. Mixer 64 may use a local oscillator signal to upconvert (or modulate) the radio-frequency signals to radio (or intermediate) frequencies. DAC circuit 62 and mixer 64 are sometimes be considered part of transmitter circuitry 30. The upconverted radio-frequency signals can then be fed to amplifier circuitry 50. The PA circuitry 52 can include one or more amplifiers coupled in series and/or in parallel that are configured to amplify signals for transmission by antenna 42.

The circuitry described above for preparing signals for transmission by antenna 42 is sometimes referred to collectively as wireless transmitting circuitry. If desired, one or more additional front end module components such as radio-frequency filter circuitry 44 of FIG. 2 (e.g., low pass filters, high pass filters, notch filters, band pass filters, attenuators, multiplexing circuitry, duplexer circuitry, diplexer circuitry, triplexer circuitry, etc.), switching circuitry 46 (e.g., one or more radio-frequency switches), impedance matching circuitry, antenna tuning circuitry (e.g., networks of capacitors, resistors, inductors, and/or switches that adjust the frequency response of antenna 42), radio-frequency coupler circuitry, charge pump circuitry, power management circuitry, and/or any other desired front-end module circuitry can optionally be coupled at the input and/or output of amplifier circuitry 50 along the radio-frequency transmission line path.

Power detection circuits can be coupled to the outputs of the radio-frequency amplifiers to enable power monitoring operations. Still referring to FIG. 3, a first power detection circuit such as power detector 70-TX may be coupled to the output of transmitting amplifier circuitry 50, whereas a second power detection circuit such as power detector 70-RX may be coupled to the output of receiving amplifier circuitry 52. Power detector 70-TX can be used to detect or measure an output power level of radio-frequency signals generated at the output of amplifier circuitry 50. The detected output power level can then be used by an automatic power control (APC) algorithm to dynamically adjust the gain of power amplifier circuitry 50 to ensure that the transmit path is outputting signals at desired power levels. The APC algorithm, which can run on processor 26 or other control circuitry in device 10, can compare the measured output power level to a reference power level. If the output power level is too high, the APC algorithm can reduce the gain of amplifier 50. If the output power level is too low, the APC algorithm can increase the gain of amplifier 50.

Power detector 70-RX can be used to detect or measure an output power level of radio-frequency signals generated at the output of receiving amplifier circuitry 52. The detected output power level can then be used by an automatic gain control (AGC) algorithm to dynamically adjust the gain of LNA circuitry 52 to ensure that the receive path is outputting signals at desired power levels regardless of the strength of signals arriving at the input of circuitry 52. The AGC algorithm, which can run on processor 26 or other control circuitry in device 10, can be used to ensure that signals are output from circuitry 52 at a constant output power level. If the input signal is weak, the AGC algorithm can increase the gain of amplifier 52 to maintain constant output level. If the input signal is strong, then the AGC algorithm can reduce the gain of amplifier 52 to prevent the output level from becoming too high.

While use of power detector 70-TX in the transmit path can enable the APC algorithm and while use of power detector 70-RX in the receive path can enable the AGC algorithm, coupling power detectors to the radio-frequency amplifiers can degrade the linearity of those amplifiers if care is not taken. For instance, attaching power detector 70-TX to the output of power amplifier circuitry 50 can degrade the linearity of amplifier 50, whereas attaching power detector 70-RX to the output of LNA circuitry 52 can degrade the linearity of amplifier 52.

Figure 4:
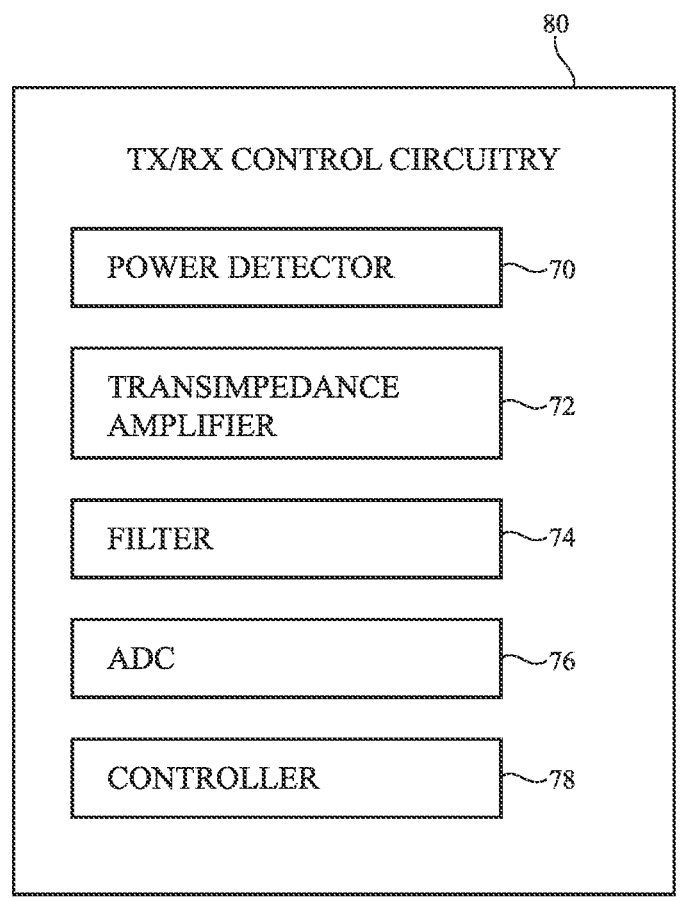
FIG. 4 is a diagram of illustrative control circuitry for a radio-frequency amplifier in accordance with some embodiments.

A power detector 70 is sometimes considered part of transmit (TX) or receive (RX) control circuitry 80 (see, e.g., FIG. 4). Transmit control circuitry 80 can include a transmit power detector 70 (see, e.g., power detector 70-TX coupled to the output of power amplifier 50 in FIG. 3), whereas receive control circuitry 80 can include a receive power detector 70 (see, e.g., power detector 70-RX coupled to the output of LNA 52 in FIG. 3). As shown in FIG. 4, TX/RX control circuitry 80 can further include an amplifier such as transimpedance amplifier 72, a filtering circuit such as filter 74, a data converter such as analog-to-digital converter (ADC) 76, and a controller 78.

Power detector 70 can have an output that is coupled to transimpedance amplifier 72 (e.g., transimpedance amplifier 72 can have an input configured to receive signals from power detector 70). Transimpedance amplifier 72 can refer to and be defined herein as a circuit that is configured to convert an input current signal to a corresponding output voltage signal. Transimpedance amplifier 72 may have an output that is coupled to filter 74 (e.g., filter 74 can have an input configured to receive signals from amplifier 72). Filter 74 can be an antialiasing filter. Filter 74 may have an output that is coupled to ADC circuit 76 (e.g., ADC 76 can have an input configured to receive signals from filter 74). ADC circuit 76 can output corresponding digital signals to controller 78. Controller 78 within TX control circuitry 80 may be used to run or execute an APC algorithm for controlling power amplifier circuitry 50, whereas controller 78 within RX control circuitry 80 may be used to run or execute or an AGC algorithm for controlling receive LNA circuitry 52. In general, controller 78 may be formed as part of processor 26 (see FIGS. 2 and 3), processing circuitry 18 (see FIG. 1), or other processing subsystem on device 10. The example of FIG. 5 in which power detector 70 has outputs coupled to a transimpedance amplifier 72 is illustrative. In general, the output of power detector 70 can be coupled to other types of downstream processing circuitry or control circuitry.

Figure 5:
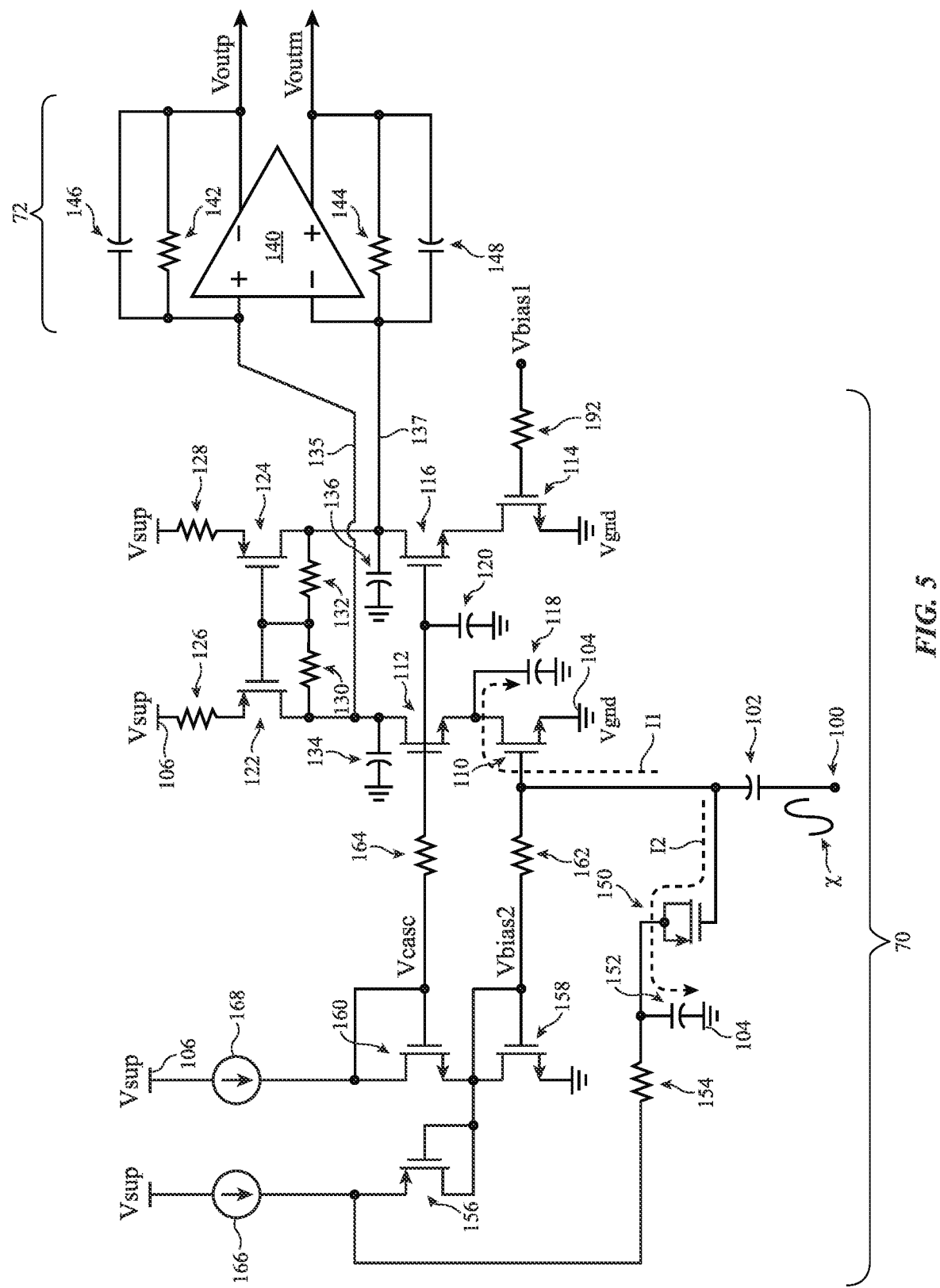
FIG. 5 is a circuit diagram of an illustrative power detection circuit with a single-ended input and a non-linearity cancellation component in accordance with some embodiments.
Figure 6A:
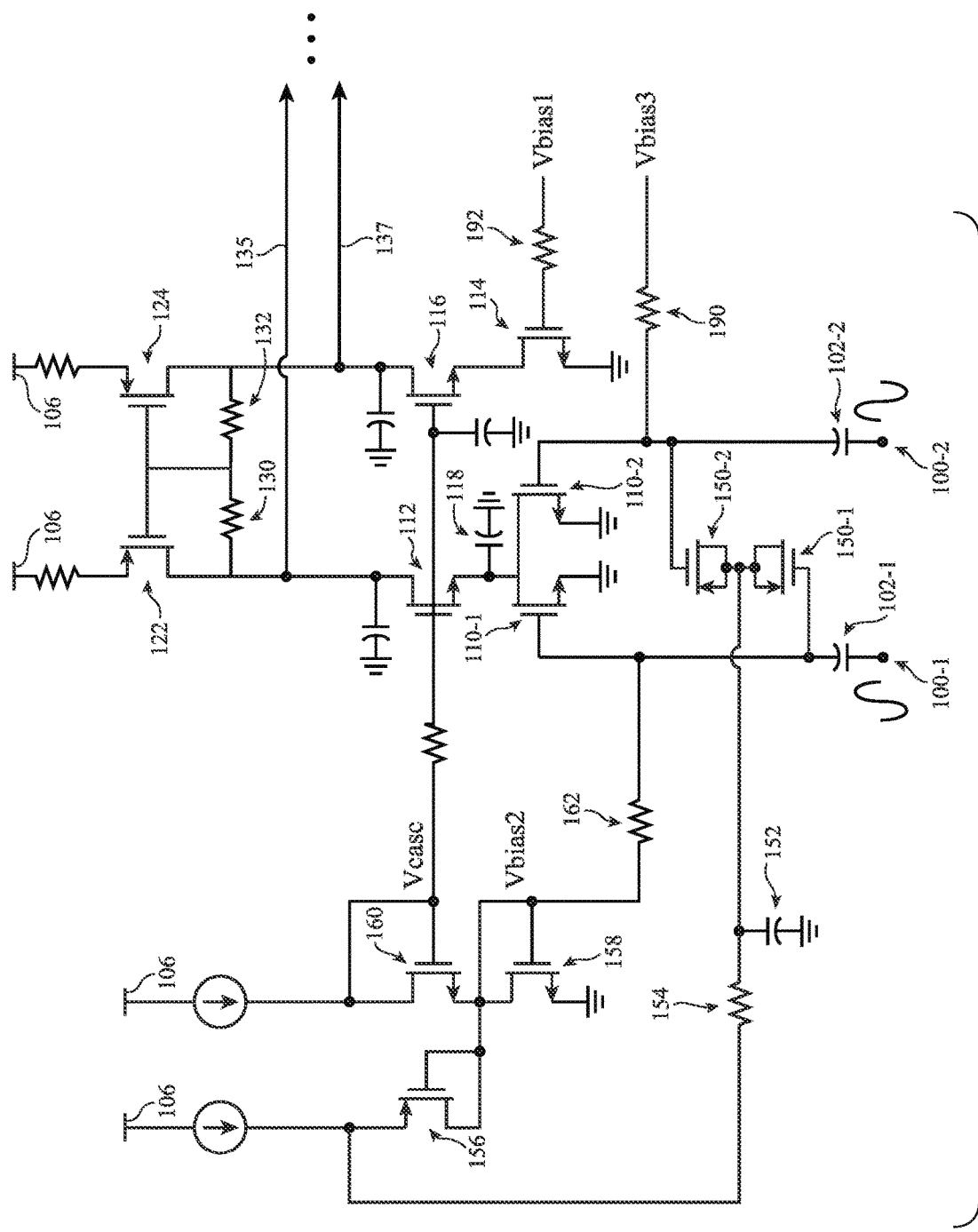
FIGS. 6A and 6B are circuit diagrams of illustrative power detection circuits having a differential input and non-linearity cancellation components in accordance with some embodiments.

FIG. 5 is a circuit diagram of an illustrative power detection circuit 70 with a single-ended input. As shown in FIG. 6A, power detection circuit 70 may include an input transistor 110, a first cascode transistor 112, a transistor 114, a second cascode transistor 116, a first load transistor 122, and a second load transistor 124. Transistors 110, 112, 114, and 116 can be n-type metal-oxide-semiconductor (NMOS) transistors, whereas load transistors 122 and 124 can be p-type metal-oxide-semiconductor (PMOS) transistors. Input transistor 110 may have a gate terminal coupled to an input port 100 via an alternating current (AC) coupling capacitor 102, a source terminal coupled to a ground line 104 (e.g., a ground power supply line on which ground voltage Vgnd is provided), and a drain terminal coupled to a shunt capacitor 118. Input port 100 may be coupled to an output of a radio-frequency power amplifier or an output of a radio-frequency low noise amplifier (e.g., power detector input port 100 may be configured to receive an amplified radio-frequency signal from associated RF amplifier circuitry). The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

Cascode transistor 112 may have a source terminal coupled to the drain terminal of input transistor 110, a gate terminal coupled to a shunt capacitor 120, and a drain terminal coupled to a shunt capacitor 134. A cascode transistor can refer to or be defined herein as a transistor that is coupled to the output of another transistor and that has its gate terminal coupled to a common (fixed) bias voltage (e.g., Vcasc). Here, cascode transistor 112 can be used to increase the output impedance of input transistor 110.

Transistor 114 may have a source terminal coupled to the ground line, a gate terminal configured to receive bias voltage Vbias1 via a series resistor 192, and a drain terminal. Resistor 192 is optional. Cascode transistor 116 may have a source terminal coupled to the drain terminal of transistor 114, a gate terminal coupled to shunt capacitor 120 (e.g., the gate terminal of transistor 116 may be shorted to the gate terminal of transistor 112), and a drain terminal coupled to a shunt capacitor 136. Configured in this way, transistors 110, 112, 114, and 116 may be operated to perform an AC voltage to DC current conversion and is sometimes referred to as an AC-to-DC converter or a squaring subcircuit (e.g., a subcircuit configured to perform a squaring function $x^2$ for an input signal x received at input port 100).

Load transistor 122 may have a drain terminal coupled to the drain terminal of cascode transistor 112, a gate terminal that is coupled to its own drain terminal via resistor 130, and a source terminal coupled to power supply line 106 (e.g., a positive power supply line on which supply voltage Vsup is provided) via source resistor 126. Similarly, load transistor 124 may have a drain terminal coupled to the drain terminal of cascode transistor 116, a gate terminal that is coupled to its own drain terminal via resistor 132, and a source terminal coupled to power supply line 106 via source resistor 128.

Power detection circuit 70 may have an output that is coupled to transimpedance amplifier 72. In the example of FIG. 5, a first power detector output node interposed between transistors 112 and 122 can be coupled to a first input of amplifier 72 via path 135, whereas a second power detector output node interposed between transistors 116 and 124 can be coupled to a second input of amplifier 72 via path 137. Amplifier 72 can include a differential amplifier 140 having a first (+) input, a second (−) input, a first output on which output voltage Voutp is generated, a second output on which output voltage Voutn is generated, feedback resistor 142 and capacitor 146 coupled between the first input and the first output of amplifier 72, and feedback resistor 144 and capacitor 148 coupled between the second input and the second output of amplifier 72. The circuit structure of transimpedance amplifier 72 as shown in FIG. 5 is exemplary. Other types of transimpedance amplifiers can be employed. The output of amplifier 72 can optionally be coupled to one or more filters, to one or more ADCs 76, and/or to one or more controller 78 as described in connection with FIG. 4.

If care is not taken, coupling power detection circuit 70 to the output of an associated radio-frequency amplifier via AC coupling capacitor 102 can degrade the linearity of that radio-frequency amplifier. In accordance with an embodiment, power detection circuit 70 can be provided with one or more non-linearity cancellation component such as a MOS capacitor 150. MOS capacitor 150 may be a p-type (p-channel) MOS capacitor. As shown in FIG. 5, MOS capacitor 150 may have a gate terminal that is coupled to the gate terminal of input transistor 110 and a body (bulk) terminal that is coupled to a shunt capacitor 152. Configured in this way, MOS capacitor 150 can be used to equalize the overall capacitance at the input node over wide input swing range, which also injects a complex current (see dotted path I2) that cancels or at least partially offsets a non-linear current (see dotted current path I1) flowing through input transistor 110. Non-linear current I1 can flow through a parasitic gate-to-drain capacitance associated with input transistor 110 into shunt capacitor 118. Non-linearity cancelling current I2 can flow through MOS capacitor 150 and into shunt capacitor 152.

MOS capacitor 150 may be further coupled to bias transistors 156, 158, and 160. Bias transistor 156 may be a PMOS device, whereas bias transistors 158 and 160 may be NMOS devices. In particular, bias transistor 156 may have a source terminal coupled to MOS capacitor 150 via a series resistor 154, a gate terminal, and a drain terminal shorted to its own gate terminal. Bias transistor 156 may receive a current from current source 166. Bias transistor 156 having gate and drain terminal that are shorted together can be referred to and defined herein as a diode-connected transistor. Bias transistor 158 may have a source terminal coupled to the ground line, a gate terminal coupled to the gate terminal of input transistor 110 via series resistor 162, and a drain terminal coupled to the drain terminal of diode-connected bias transistor 156. Series resistor 162 can optionally be replaced by a series inductor. The drain and gate terminals of transistor 158 are also shorted together, so transistor 158 can also be referred to as a diode-connected transistor. Arranged in this way, diode-connected bias transistor 158 may provide a bias voltage Vbias2 to the gate terminal of input transistor 110. Bias voltage Vbias2 can optionally be shorted to Vbias1 (e.g., Vbias1 and Vbias2 can be equal). In other embodiments, Vbias1 and Vbias2 can be different.

Bias transistor 160 may have a source terminal coupled to the drain terminal of diode-connected bias transistor 158, a gate terminal coupled to the gate terminal of cascode transistor 112 via series resistor 164, and a drain terminal configured to receive a current from current source 168. The drain and gate terminals of transistor 160 are also shorted together, so transistor 160 can also be referred to as a diode-connected transistor. Arranged in this way, diode-connected bias transistor 160 may provide a cascode bias voltage Vcasc to the gate terminals of cascode transistors 112 and 116. Transistors 156, 158, and 160 arranged this is way can sometimes be referred to collectively as a biasing circuit. A biasing circuit configured in the way shown in FIG. 5 can be beneficial and technically advantageous by enabling at least the bias voltages Vbias1, Vbias2, and/or Vcasc to track variations in process, voltage, and/or temperature.

The embodiment of FIG. 5 in which power detection circuit 70 has a single-ended input is illustrative. FIG. 6A shows another embodiment of power detection circuit 70 having a differential input. As shown in FIG. 6A, power detector 70 can include a first input transistor 110-1 and a second input transistor 110-2. First input transistor 110-1 may have a source terminal coupled to the ground line, a drain terminal coupled to shunt capacitor 118, and a gate terminal coupled to a first input port 100-1 via a first AC coupling capacitor 102-1. Second input transistor 110-2 may have a source terminal also coupled to ground line, a drain terminal coupled to shunt capacitor 118, and a gate terminal coupled to a second input port 100-2 via a second AC coupling capacitor 102-2. The gate terminal of input transistor 110-1 can be configured to receive bias voltage Vbias2 via resistor 162. The gate terminal of input transistor 110-2 can be configured to receive a bias voltage Vbias3 from series resistor 190. Series resistors 162 and 190 can optionally be replaced by series inductors. Input ports 100-1 and 100-2 can serve collectively as a differential input for power detection circuit 70. Input ports 100-1 and 100-2 can be coupled to a differential output port of an associated radio-frequency amplifier (e.g., a transmitting power amplifier or a receiving low noise amplifier).

In accordance with an embodiment, power detection circuit 70 can be provided with one or more non-linearity cancellation component such as MOS capacitors 150-1 and 150-2. MOS capacitors 150-1 and 150-2 may be p-type (p-channel) MOS capacitors. This is exemplary. If desired, varactors, capacitors (e.g., metal-insulator-metal capacitors, metal-oxide-metal capacitors, etc.), or other types of capacitive component can be employed as non-linearity cancelling components. As shown in FIG. 6A, MOS capacitor 150-1 may have a gate terminal that is coupled to the gate terminal of first input transistor 110-1 and a body (bulk) terminal that is coupled to MOS capacitor 150-2. Symmetrically, MOS capacitor 150-2 may have a gate terminal that is coupled to the gate terminal of second input transistor 110-2 and a body (bulk) terminal that is coupled to the body terminal of MOS capacitor 150-1. Configured in this way, MOS capacitors 150-1 and 150-2 can be used to equalize the overall capacitance over wide input swing range at the differential input, which also injects complex currents that cancel or at least partially offset non-linear currents flowing through the input transistors 110-1 and 110-2 (e.g., MOS capacitor 150-1 can be configured to generate a current that at least partially cancels a non-linear current associated with input transistor 110-1, whereas MOS capacitor 150-2 can be configured to generate a current that at least partially cancels a non-linear current associated with input transistor 110-2). Operated in this way, the third-order intercept point IP3 of the associated radio-frequency amplifier can be dramatically improved, as described in connection with FIG. 7.

The body terminals of MOS capacitors 150-1 and 150-2 can be coupled to shunt capacitor 152. The body terminals of MOS capacitors 150-1 and 150-2 can also be coupled to the biasing circuit including the diode-connected bias transistors 156, 158, and 160 via series resistor 154. A biasing circuit configured in the way shown in FIG. 6 can be beneficial and technically advantageous by enabling at least the bias voltages Vbias1, Vbias2, and/or Vcasc to track variations in process, voltage, and/or temperature.

The remaining circuit components of FIG. 6A can be identical in structure and function to that already described in connection with FIG. 5 and need not be reiterated in detail to avoid obscuring the present embodiments. In general, power detector 70 can have output nodes that are coupled to any type of downstream radio-frequency control circuitry not limited to a transimpedance amplifier. The example of FIG. 6A in which p-type MOS capacitors 150-1 and 150-2 are connected in a back-to-back configuration (e.g., where the body terminals are shorted to each other) is illustrative. As another example, the p-type MOS capacitors can be connected in a face-to-face configuration in which the gate terminals are shorted to each other, and the body terminals are coupled to respective input ports. As another example, n-type MOS capacitors can be used instead of p-type MOS capacitors. The n-type MOS capacitors can be arranged in a back-to-back configuration or a face-to-face configuration. Furthermore, the polarity of all of the transistor components shown in FIGS. 5 and 6A are illustrative. In other embodiments, the polarity of each transistor component can be flipped (e.g., NMOS transistors can be replaced with PMOS transistors, and vice versa). Similarly p-type MOS capacitors can be replaced with n-type MOS capacitors, if desired. In general, power detection circuit 70 can be a single-ended circuit or a differential circuit (e.g., power detection circuit 70 can have a single-ended or differential input and/or a single-ended or differential output).

Figure 6B:
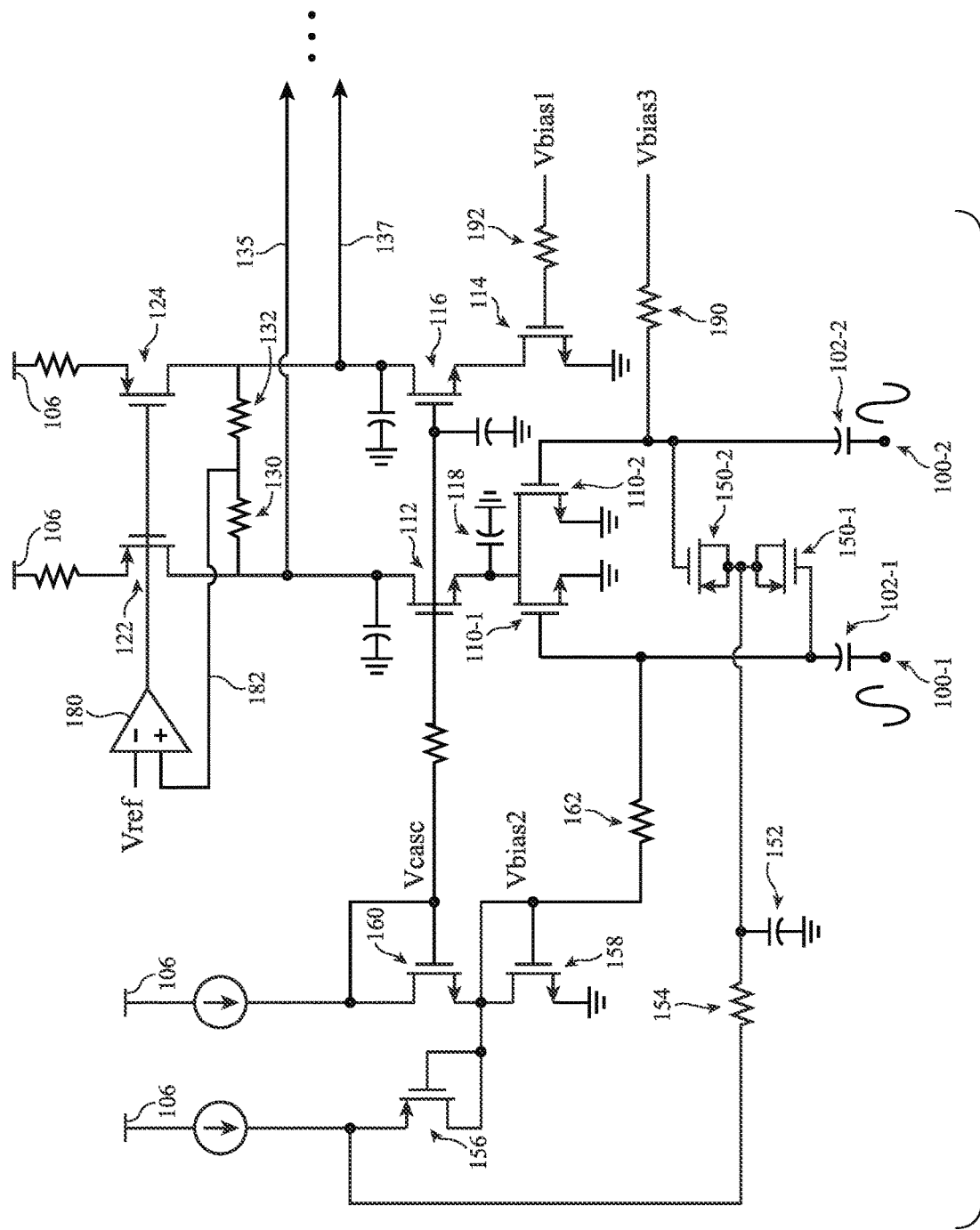

The example of FIG. 6A in which the gate terminals of load transistors 122 and 124 are coupled to a node between resistors 130 and 132 is illustrative. FIG. 6B shows another suitable biasing scheme for load transistors 122 and 124 using an operational amplifier 180. As shown in FIG. 6B, load transistor 122 may have a drain terminal coupled to the drain terminal of cascode transistor 112, a gate terminal, and a source terminal coupled to power supply line 106 (e.g., a positive power supply line on which supply voltage Vsup is provided) via source resistor 126. Similarly, load transistor 124 may have a drain terminal coupled to the drain terminal of cascode transistor 116, a gate terminal that is coupled to the gate terminal of transistor 122, and a source terminal coupled to power supply line 106 via source resistor 128. Resistors 130 and 132 may be coupled between the drain terminals of transistors 122 and 124. Operational amplifier 180 can have a first (−) input configured to receive a reference voltage Vref, a second (+) input coupled to a node between resistors 130 and 132 via path 182, and an output coupled to the gate terminals of transistors 122 and 124. This biasing scheme is merely illustrative and can optionally be applied to the power detection circuit of FIG. 5. In general, other biasing schemes for biasing load transistors 122 and 124 can be employed.

Figure 7:
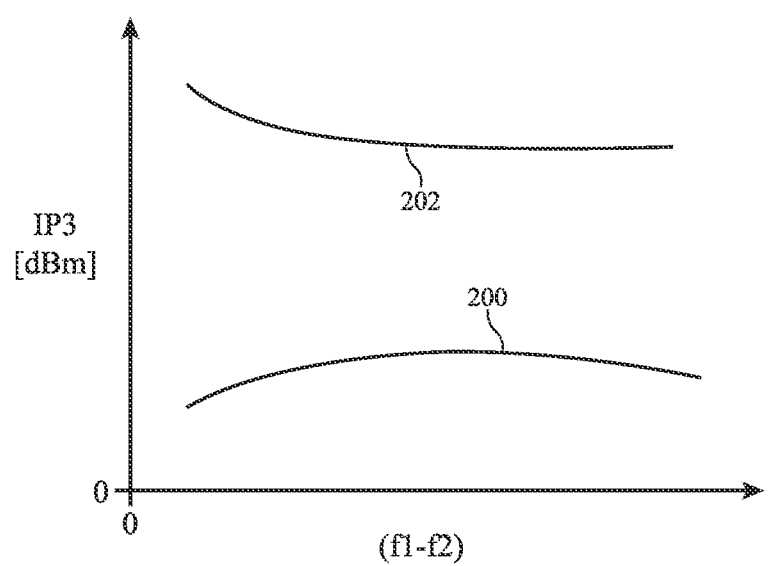
FIG. 7 is a plot illustrating a linearity improvement provided by one or more non-linearity cancelling components in a radio-frequency amplifier power detector in accordance with some embodiments.

FIG. 7 is a plot illustrating a linearity improvement provided non-linearity cancelling components 150-1 and 150-2 in radio-frequency amplifier power detector 70. In particular, FIG. 7 plots the third-order intercept point (IP3) in dBm as a function of the frequency difference for a two tone injection. The third-order intercept point IP3 is a measure of the linearity, associated with third-order intermodulation distortion (IMD3), of a weakly nonlinear circuit. Intercept point IP3 may correspond to an input or output power level at which the third-order intermodulation distortion products generated by the nonlinear circuit are equal in power to the desired signal level.

Intermodulation distortion arises when at least two signals at different frequencies are applied to a non-linear circuit and when the amplitude modulation or mixing (multiplication) of the two signals when their sum is raised to a power greater than one generates intermodulation products that are not just at harmonic frequencies (integer multiples) of either input signal but also at the sum and differences of the input signal frequencies and also at sums and differences of multiples of those frequencies. For example, consider a two tone scenario in which the first tone is at angular frequency $\omega_1$ (i.e., equal to $2\pi f_1$), whereas the second tone is at angular frequency $\omega_2$ (i.e., equal to $2\pi f_2$). Angular frequency $\omega_2$ may be greater than $\omega_1$. Of particular interest are the third-order intermodulation (IM3) products generated at $(2\omega_1-\omega_2)$ and $(2\omega_2-\omega_1)$. In particular, if the difference between $\omega_1$ and $\omega_2$ is relatively small, then the IM3 components generated at $(2\omega_1-\omega_2)$ and $(2\omega_2-_1)$ will appear in the vicinity of $\omega_1$ and $\omega_2$. The magnitude of these IM3 tones (see the third-order tones appearing on either side of the two signal tones) directly contribute to third-order intermodulation distortion (IMD3).

In FIG. 7, curve 200 represents the IP3 profile of a radio-frequency amplifier coupled to a power detection circuit that does not include any non-linearity cancellation components. On the other hand, curve 202 represents the IP3 profile of a radio-frequency amplifier coupled to a power detection circuit 70 that includes one or more non-linearity cancellation component such as MOS capacitors 150-1 and 150-2. As shown in FIG. 7, curve 202 yields much higher IP3 levels than curve 200 across a wide range of frequencies, indicating that the non-linearity cancellation component is able to cancel out or mitigate a large portion of the third-order intermodulation distortion.

The methods and operations described above in connection with FIGS. 1-7 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Wireless circuitry comprising:
a radio-frequency amplifier; and
a power detection circuit coupled to an output of the radio-frequency amplifier, the power detection circuit including
an input transistor having a gate terminal coupled to the output of the radio-frequency amplifier, and
a plurality of non-linearity cancellation components, wherein at least one non-linearity cancellation component in the plurality of non-linearity cancellation components is coupled to the gate terminal of the input transistor.

2. The wireless circuitry of claim 1, wherein the at least one non-linearity cancellation component comprises a metal-oxide-semiconductor (MOS) capacitor.

3. The wireless circuitry of claim 1, wherein the input transistor comprises an n-type metal-oxide-semiconductor transistor and wherein the at least one non-linearity cancellation component comprises a p-type metal-oxide-semiconductor capacitor.

4. The wireless circuitry of claim 1, wherein the at least one non-linearity cancellation component comprises a metal-oxide-semiconductor (MOS) capacitor having a first terminal coupled to the gate terminal of the input transistor and having a second terminal coupled to a shunt capacitor.

5. The wireless circuitry of claim 1, wherein the at least one non-linearity cancellation component comprises a metal-oxide-semiconductor (MOS) capacitor having a gate terminal coupled to the gate terminal of the input transistor and having a body terminal coupled to a shunt capacitor.

6. The wireless circuitry of claim 5, wherein the power detection circuit further comprises:
an additional input transistor having a gate terminal coupled to the output of the radio-frequency amplifier; and
an additional MOS capacitor having a gate terminal coupled to the gate terminal of the additional input transistor and having a body terminal coupled to the shunt capacitor.

7. The wireless circuitry of claim 6, wherein the power detection circuit further comprises:
a first bias transistor having a source terminal coupled to the body terminal of the MOS capacitor and coupled to a first current source, a gate terminal, and a drain terminal shorted to its gate terminal.

8. The wireless circuitry of claim 7, wherein the power detection circuit further comprises:
a second bias transistor having a source terminal coupled to a ground line, a drain terminal coupled to the drain terminal of the first bias transistor, and a gate terminal shorted to its drain terminal, the second bias transistor being configured to provide a bias voltage to the gate terminal of the input transistor.

9. The wireless circuitry of claim 8, wherein the power detection circuit further comprises:
a first cascode transistor coupled in series with the input transistor;
a second cascode transistor; and
a third bias transistor having a source terminal coupled to the drain terminal of the second bias transistor, a drain terminal coupled to a second current source, and a gate terminal shorted to its drain terminal, the third bias transistor being configured to provide a cascode bias voltage to the gate terminals of the first and second cascode transistors.

10. The wireless circuitry of claim 9, wherein:
the MOS capacitor comprises a p-type MOS capacitor;
the first bias transistor comprises a p-type bias transistor; and
the second and third bias transistors comprise n-type bias transistors.

11. A power detection circuit comprising:
a first input transistor configured to receive a radio-frequency signal;
a second input transistor configured to receive the radio-frequency signal;
a biasing circuit configured to provide bias voltages for the first and second input transistors; and
a plurality of non-linearity cancellation components, wherein a first non-linearity cancellation component in the plurality of non-linearity cancellation components is coupled between the first input transistor and the biasing circuit.

12. The power detection circuit of claim 11, further comprising:
wherein the plurality of non-linearity cancellation components further comprises a second non-linearity cancellation component coupled between the second input transistor and the biasing circuit.

13. The power detection circuit of claim 12, wherein:
the first non-linearity cancellation component comprises a first metal-oxide-semiconductor (MOS) capacitor having a gate terminal coupled to a gate terminal of the first input transistor and having a body terminal coupled to the biasing circuit; and
the second non-linearity cancellation component comprises a second metal-oxide-semiconductor (MOS) capacitor having a gate terminal coupled to a gate terminal of the second input transistor and having a body terminal coupled to the biasing circuit.

14. The power detection circuit of claim 13, further comprising:
a cascode transistor coupled to the first and second input transistors, wherein the biasing circuit comprises
a first diode-connected bias transistor having a terminal coupled to the first and second non-linearity cancellation components and coupled to a first current source,
a second diode-connected bias transistor coupled to the first diode-connected bias transistor and configured to output the bias voltages, and
a third diode-connected bias transistor coupled to the second diode-connected bias transistor, having a terminal coupled to a second current source, and configured to output a cascode bias voltage to the cascode transistor.

15. The power detection circuit of claim 13, wherein the gate terminal of the first input transistor is coupled to a radio-frequency amplifier via a first capacitor and wherein the gate terminal of the second input transistor is coupled to the radio-frequency amplifier via a second capacitor.

16. Circuitry comprising:
an input transistor configured to receive a radio-frequency signal from a radio-frequency amplifier;
a biasing circuit configured to output a bias voltage for the input transistor and configured to track temperature and voltage variations; and
a plurality of non-linearity cancellation components, wherein at least one non-linearity cancellation component in the plurality of non-linearity cancellation components is configured to generate a current that at least partially cancels a non-linear current associated with the input transistor.

17. The circuitry of claim 16, wherein the at least one non-linearity cancellation component comprises a metal-oxide-semiconductor (MOS) capacitor having a first terminal coupled a gate terminal of the Input transistor and having a second terminal coupled to the biasing circuit.

18. The circuitry of claim 16, further comprising:
an additional input transistor configured to receive the radio-frequency signal from the radio-frequency amplifier; and
wherein the plurality of non-linearity cancellation components further includes an additional non-linearity cancellation component configured to generate a current that at least partially cancels a non-linear current associated with the additional input transistor.

19. The circuitry of claim 18, wherein:
the input transistor and the additional input transistor comprise n-type input transistors;
the at least one non-linearity cancellation component comprises a first p-type metal-oxide-semiconductor (MOS) capacitor having a gate terminal coupled a gate terminal of the input transistor and having a body terminal coupled to the biasing circuit; and
the additional non-linearity cancellation component comprises a second p-type metal-oxide-semiconductor (MOS) capacitor having a gate terminal coupled a gate terminal of the additional input transistor and having a body terminal coupled to the biasing circuit.

20. The circuitry of claim 19, wherein the biasing circuit comprises a p-type bias transistor having a source terminal coupled to the first and second p-type MOS capacitors and coupled to a current source, a gate terminal, and a drain terminal coupled its gate terminal.

* * * * *

UNITED STATES PATENT AND TRADEMARK OFFICE
CERTIFICATE OF CORRECTION

| | |
|---|---|
| PATENT NO. | : 12,407,428 B2 |
| APPLICATION NO. | : 18/181466 |
| DATED | : September 2, 2025 |
| INVENTOR(S) | : Mohamed Abouzied and Abbas Komijani |

It is certified that error appears in the above-identified patent and that said Letters Patent is hereby corrected as shown below:

In the Claims

Column 17, Lines 56-58, "further comprising: wherein the" should read -- wherein the --

Column 18, Line 42, "coupled a gate terminal" should read -- coupled to a gate terminal --

Column 18, Line 42, "Input" should read -- input --

Column 18, Lines 47-48, "amplifier; and wherein" should read -- amplifier, wherein --

Column 18, Line 58, "coupled a gate" should read -- coupled to a gate --

Column 18, Line 63, "coupled a gate" should read -- coupled to a gate --

Column 19, Line 3, "coupled its gate" should read -- coupled to its gate --

Page 1 of 1

Signed and Sealed this
Fourteenth Day of October, 2025

John A. Squires
*Director of the United States Patent and Trademark Office*